US012567843B2

(12) United States Patent
Honda et al.

(10) Patent No.: US 12,567,843 B2
(45) Date of Patent: Mar. 3, 2026

(54) MATCHING CIRCUIT

(71) Applicant: Murata Manufacturing Co., Ltd., Kyoto (JP)

(72) Inventors: Yuri Honda, Kyoto (JP); Jun Enomoto, Kyoto (JP); Mitsunori Samata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 681 days.

(21) Appl. No.: 18/054,191

(22) Filed: Nov. 10, 2022

(65) Prior Publication Data

US 2023/0155556 A1     May 18, 2023

(30) Foreign Application Priority Data

Nov. 12, 2021    (JP) ................................. 2021-184605

(51) Int. Cl.
| | |
|---|---|
| *H03F 1/56* | (2006.01) |
| *H03F 3/19* | (2006.01) |
| *H03F 3/24* | (2006.01) |
| *H03F 3/60* | (2006.01) |

(52) U.S. Cl.
CPC .............. *H03F 1/565* (2013.01); *H03F 3/19* (2013.01); *H03F 3/245* (2013.01); *H03F 3/602* (2013.01); *H03F 2200/318* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 10,193,521 | B2 * | 1/2019 | Bakalski | ................. H01F 29/02 |
| 10,700,655 | B2 * | 6/2020 | Medra | ..................... H03F 1/565 |
| 2009/0085666 | A1 | 4/2009 | Ohnishi et al. | |
| 2019/0140598 | A1 * | 5/2019 | Schultz | ................. H03F 1/0288 |

FOREIGN PATENT DOCUMENTS

JP          2009-88770 A      4/2009

* cited by examiner

*Primary Examiner* — Andrea Lindgren Baltzell
*Assistant Examiner* — Malane Lieng
(74) *Attorney, Agent, or Firm* — McDonald Hopkins LLC

(57) ABSTRACT

A matching circuit includes: a first wire having one end connected to a first terminal and another end; a second wire having one end connected to the other end of the first wire and another end connected to a first reference potential and electromagnetically coupled to the first wire; and a third wire having one end connected to the one end of the second wire and another end connected to a second terminal and electromagnetically coupled to at least one of the first wire and the second wire.

9 Claims, 11 Drawing Sheets

FIG. 7

MATCHING CIRCUIT

CROSS REFERENCE TO RELATED APPLICATION

This application claims priority from Japanese Patent Application No. 2021-184605 filed on Nov. 12, 2021. The content of this application is incorporated herein by reference in its entirety.

BACKGROUND OF THE DISCLOSURE

1. Field of the Disclosure

The present disclosure relates to matching circuits.

2. Description of the Related Art

There is a radio frequency (RF) power amplifier including a transmission line transformer (for example, refer to Japanese Unexamined Patent Application Publication No. 2009-88770). FIG. 13 is an equivalent circuit diagram of the last amplifier stage of a RF power amplifier described as the related art in Japanese Unexamined Patent Application Publication No. 2009-88770. In this RF power amplifier, a transmission line transformer (TLT) is connected as an impedance matching circuit between a heterojunction bipolar transistor Q and an output terminal Pout of a RF power module.

BRIEF SUMMARY OF THE DISCLOSURE

In the transmission line transformer described in Japanese Unexamined Patent Application Publication No. 2009-88770, there is a possibility that its band is narrowed. Here, a method of widening the band by connecting a plurality of transmission line transformers can be thought. However, this is not preferable because the circuit size is increased.

The present disclosure was made in consideration of these circumstances, and is to provide a matching circuit capable of favorably matching impedance between a circuit at a preceding stage and a circuit at a subsequent stage in a wide frequency band, while an increase in circuit size is suppressed.

A matching circuit according to an aspect of the present disclosure includes: a first wire having one end connected to a first terminal and another end; a second wire having one end connected to the other end of the first wire and another end connected to a first reference potential and electromagnetically coupled to the first wire; and a third wire having one end connected to the one end of the second wire and another end connected to a second terminal and electromagnetically coupled to at least one of the first wire and the second wire.

According to the present disclosure, it is possible to provide a matching circuit capable of favorably matching impedance between a circuit at a preceding stage and a circuit at a subsequent stage in a wide frequency band, while an increase in circuit size is suppressed.

BRIEF DESCRIPTION OF THE SEVERAL VIEWS OF THE DRAWINGS

FIG. 7 is a diagram schematically depicting a layout of a transformer 301.

DETAILED DESCRIPTION OF THE DISCLOSURE

Figure 1:
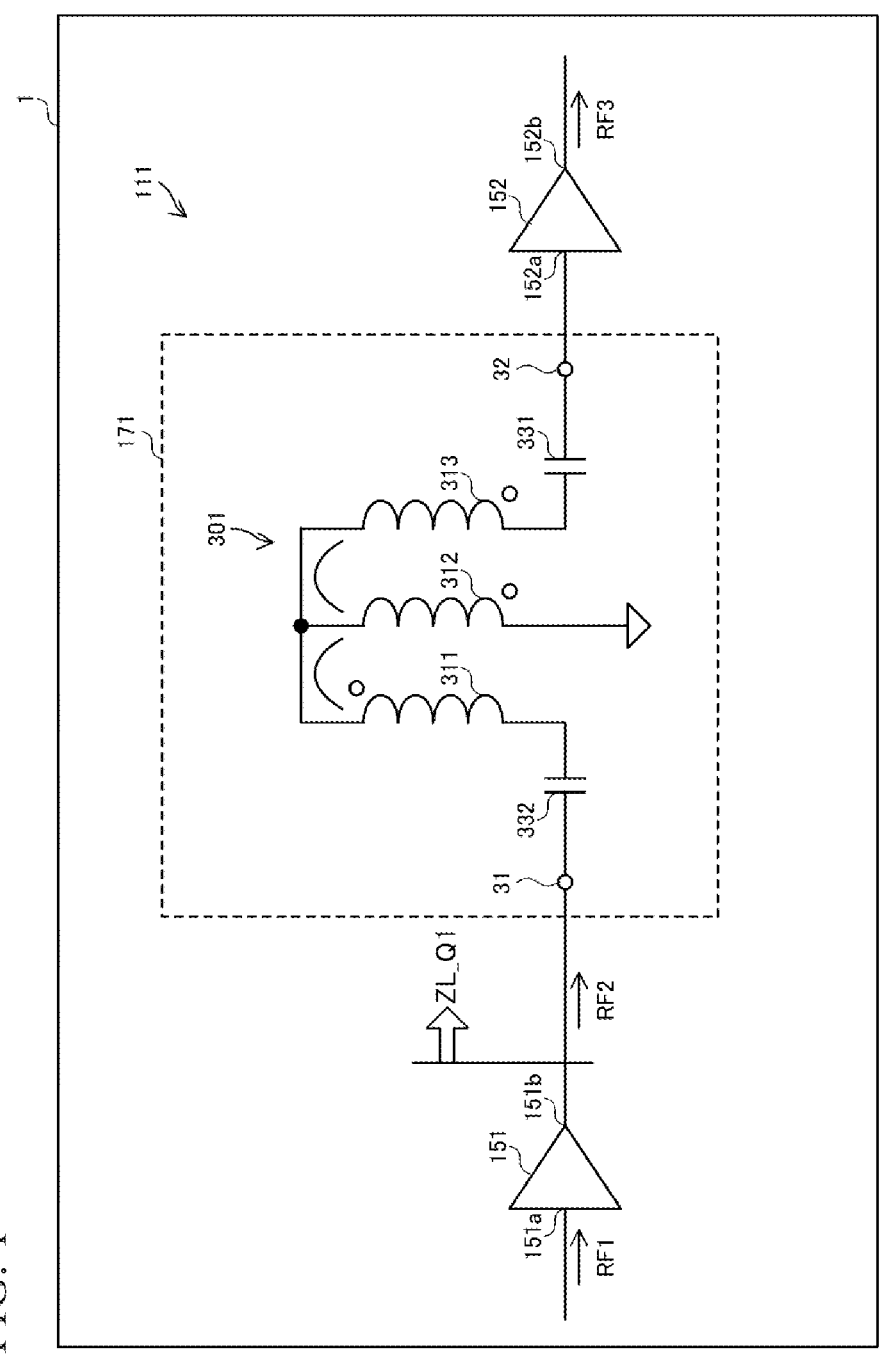
FIG. 1 is a circuit diagram of a power amplifier circuit 111.

Embodiments of the present disclosure are described in detail below with reference to the drawings. Note that the same components are provided with the same reference characters and redundant description is omitted as much as possible.

Embodiment 1

A matching circuit 171 and a power amplifier circuit 111 according to Embodiment 1 are described. FIG. 1 is a circuit diagram of the power amplifier circuit 111. As depicted in FIG. 1, a semiconductor device 1 includes the power amplifier circuit 111. The semiconductor device 1 is, for example, a semiconductor chip having the power amplifier circuit 111 formed thereon. The power amplifier circuit 111 is a two-stage amplifier circuit which amplifies a signal RF1 and outputs an amplified signal RF3.

The power amplifier circuit 111 includes an amplifier 151 (first amplifier), an amplifier 152 (second amplifier), and a matching circuit 171. The matching circuit 171 includes a transformer 301, a capacitor 331 (first capacitor), and a capacitor 332 (second capacitor). The transformer 301 includes a coil 311 (first wire), a coil 312 (second wire), and a coil 313 (third wire).

In the present embodiment, the amplifier such as the amplifiers 151 and 152 is configured of a bipolar transistor such as, for example, a heterojunction bipolar transistor (HBT). Note that the amplifier such as the amplifiers 151 and 152 may be configured of another transistor such as a metal-oxide-semiconductor field-effect transistor (MOS-FET). In this case, the base, the collector, and the emitter are read as the gate, the drain, and the source, respectively.

The amplifiers 151 and 152 are amplifiers at an initial stage (driver stage) and a subsequent stage (power stage), respectively. The matching circuit 171 is an interstage matching circuit provided between the amplifier 151 and the amplifier 152 in cascading connection to the amplifier 151 to match impedance between the amplifier 151 and the amplifier 152.

The amplifier 151 has an input terminal 151a and an output terminal 151b. The input terminal 151a is supplied with the signal RF1. The output terminal 151b is connected to an input terminal 31 (first terminal) in the matching circuit 171 and outputs an amplified signal RF2 obtained by amplifying the signal RF1.

The capacitor 332 in the matching circuit 171 has one end connected to the input terminal 31 and another end. Note that the capacitor 332 does not have to be provided.

The coil 311 in the transformer 301 has one end connected to the other end of the capacitor 332 and another end. The coil 312 has one end connected to the other end of the coil 311 and another end connected to the ground (first reference potential) to be electromagnetically coupled to the coil 311. Here, the polarity of the coil 311 is different from the polarity of the coil 312.

The coil 313 has one end connected to the one end of the coil 312 and another end to be electromagnetically coupled to the coil 312. Here, the polarity of the coil 313 is the same as the polarity of the coil 312. The inductance of the coil 313 is smaller than the inductance of the coil 311 and the inductance of the coil 312. Note that the coils 311, 312, and 313 function as inductors in a lumped constant circuit when the signal RF1 is at low frequency. On the other hand, the coils 311, 312, and 313 function as transmission lines (wires for transmitting high-frequency signals) handled as distributed constant circuits when the signal RF1 is at high frequency.

The capacitor 331 has one end connected to the other end of the coil 313 and another end connected to an output terminal 32 (second terminal). Note that the capacitor 331 does not have to be provided.

The amplifier 152 has an input terminal 152a and an output terminal 152b. The input terminal 152a is connected to the output terminal 32 and is supplied with the amplified signal RF2 passing though the matching circuit 171. The output terminal 152b outputs the amplified signal RF3 obtained by amplifying the amplified signal RF2.

Reference Example

Figure 2:
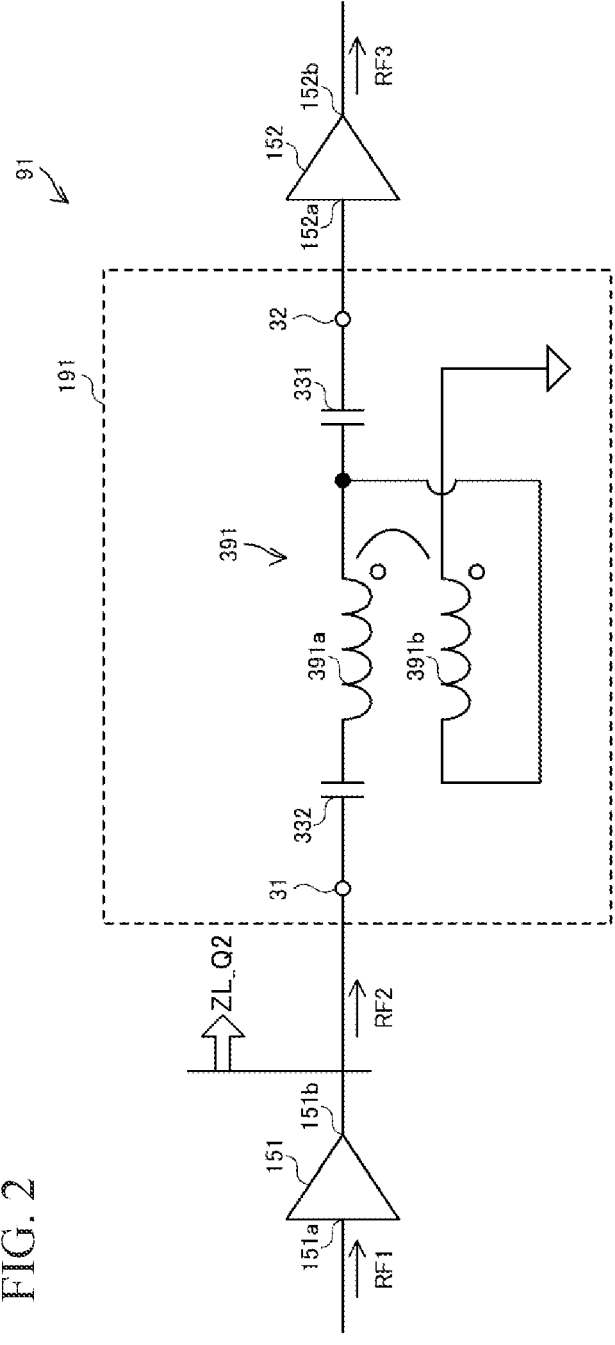
FIG. 2 is a circuit diagram of a power amplifier circuit 91 as a reference example.

A power amplifier circuit 91 as a reference example is described. FIG. 2 is a circuit diagram of the power amplifier circuit 91 as a reference example. In the power amplifier circuit 91, compared with the power amplifier circuit 111 (refer to FIG. 1), a transformer 391 is provided in place of the transformer 301.

The transformer 391 has a structure similar to that of the transmission line transformer (TLT) described in Japanese Unexamined Patent Application Publication No. 2009-88770 and includes coils 391a and 391b. The coil 391a has one end connected to the other end of the capacitor 332 and another end connected to the one end of the capacitor 331. The coil 391b has one end connected to the other end of the coil 391a and another end connected to the ground.

[Frequency Change of Return Loss]

Figure 3:
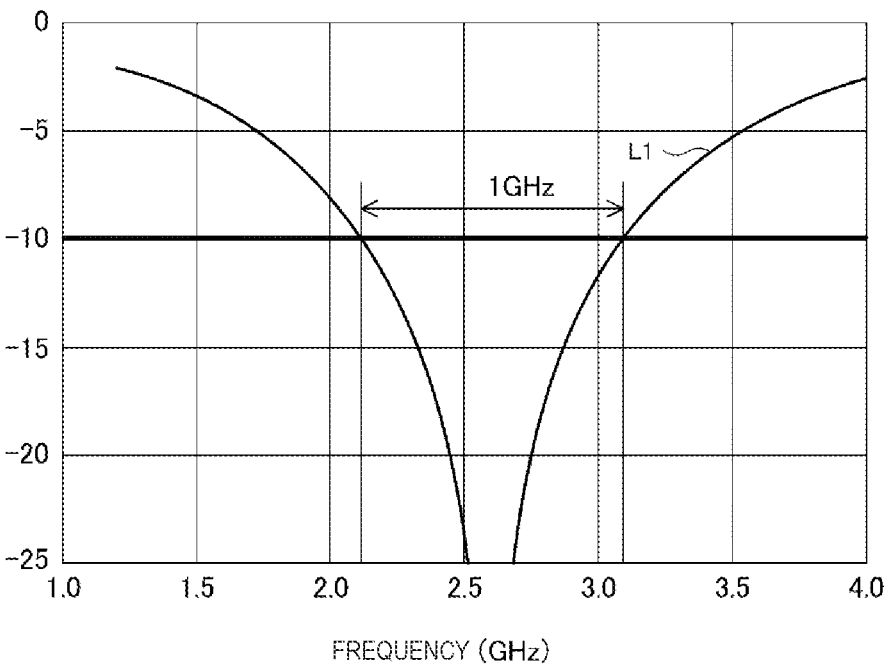
FIG. 3 is a graph depicting one example of a result of simulation of return loss in the power amplifier circuit 111.

The frequency change of return loss at the output terminal 151b of the amplifier 151 at the driver stage is described. FIG. 3 is a graph depicting one example of a result of simulation of return loss in the power amplifier circuit 111. Note in FIG. 3 that the horizontal axis represents frequency in units of "GHz" and the vertical axis represents return loss in units of "dB".

A curve L1 indicates the frequency change of return loss in the power amplifier circuit 111. Here, the return loss is 20×log(|Gin1|). |Gin1| is an absolute value of a reflection coefficient based on an impedance ZL_Q1 when the amplifier 152 is viewed from the output terminal 151b in the power amplifier circuit 111 (refer to FIG. 1). As the value of the return loss is smaller, impedance matching by the matching circuit 171 is more favorable.

The inventors conducted a simulation of frequency change of return loss by taking a circuit constant of each circuit element in the power amplifier circuit 111 and the power amplifier circuit 91 as a parameter. The inventors optimized the parameters so that a frequency range with small return loss is large in a frequency range, for example, approximately from 1.2 GHz to 4.0 GHz.

As depicted in FIG. 3, for example, if the impedance can be favorably matched when the return loss is lower than or equal to −10, in the power amplifier circuit 111, the impedance can be favorably matched by the matching circuit 171 in a wide frequency range of 1 GHz from 2.1 GHz to 3.1 GHz.

Figure 4:
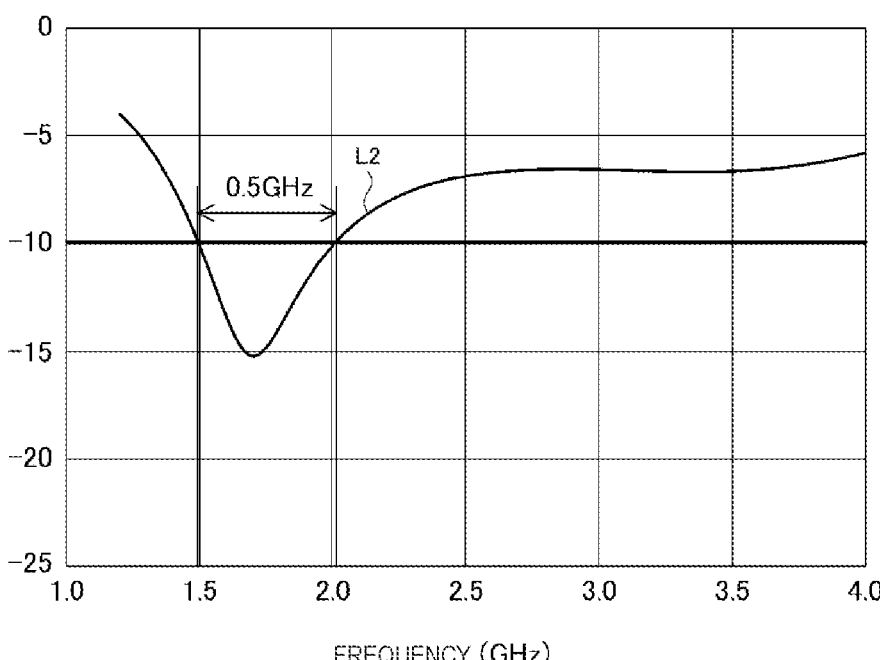
FIG. 4 is a graph depicting one example of a result of simulation of return loss in the power amplifier circuit 91 as a reference example.

FIG. 4 is a graph depicting one example of a result of simulation of return loss in the power amplifier circuit 91 as a reference example. Note that FIG. 4 is read in a manner similar to that in FIG. 3.

A curve L2 indicates return loss in the power amplifier circuit 91, that is, the frequency change of 20×log(|Gin2|). Here, |Gin2| is an absolute value of a reflection coefficient based on an impedance ZL_Q2 when the amplifier 152 is viewed from the output terminal 151b in the power amplifier circuit 91 (refer to FIG. 2).

For example, when the impedance is favorably matched where the return loss is lower than or equal to −10, the frequency range in which the impedance can be favorably matched in the power amplifier circuit 91 is a narrow range of 0.5 GHz from 1.5 GHz to 2.0 GHz. Therefore, in the power amplifier circuit 111, compared with the power amplifier circuit 91, the impedance can be favorably matched in a wider frequency range.

[Frequency Change of Pass Band Loss]

Figure 5:
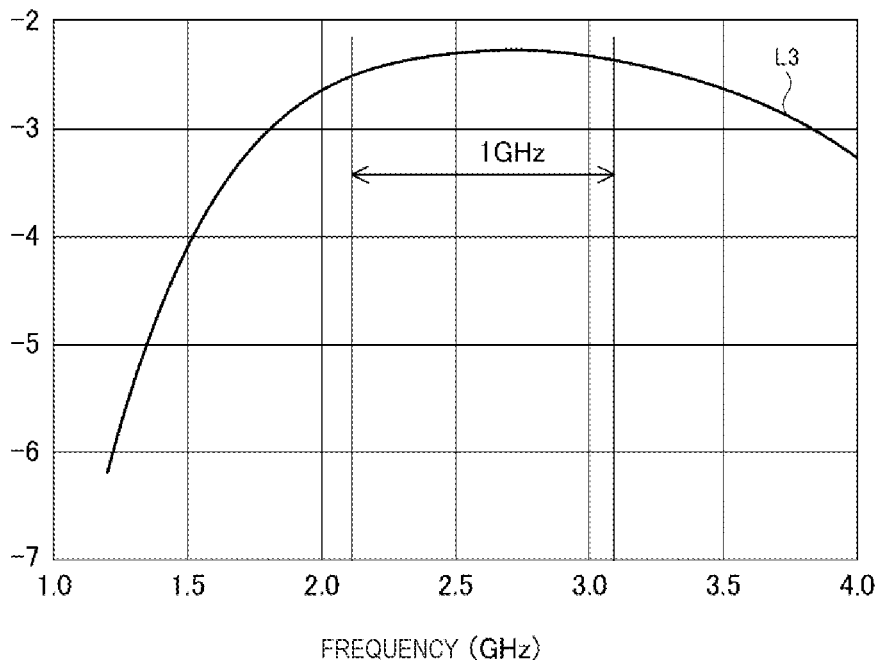
FIG. 5 is a graph depicting one example of a result of simulation of pass band loss in the power amplifier circuit 111.

The frequency change of pass band loss from the output terminal 151b of the amplifier 151 at the driver stage to the input terminal 152a of the amplifier 152 at the power stage is described. FIG. 5 is a graph depicting one example of a result of simulation of pass band loss in the power amplifier circuit 111 (refer to FIG. 1). Note in FIG. 5 that the horizontal axis represents frequency in units of "GHz" and the vertical axis represents pass band loss in units of "dB". As the value of the pass band loss is larger, the output power of the amplifier 151 is favorably transferred to the amplifier 152.

A curve L3 indicates the frequency change of pass band loss in the power amplifier circuit 111. Here, the pass band loss is 10×log(1−|Gin1|×|Gin1|).

In the power amplifier circuit 111, the pass band loss is −2.5 dB to −2.4 dB in 2.1 GHz to 3.1 GHz where the return loss is lower than or equal to −10.

Figure 6:
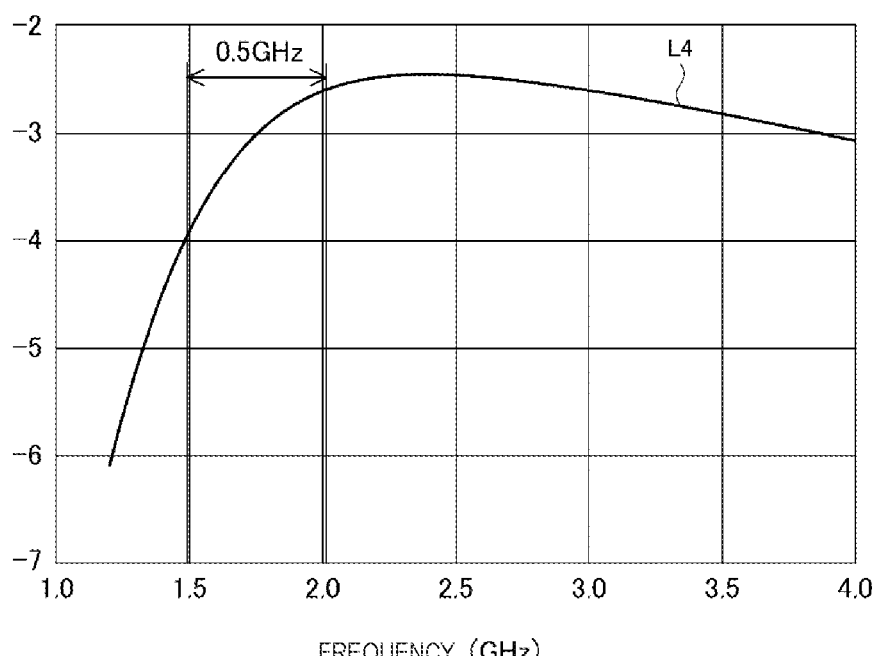
FIG. 6 is a graph depicting one example of a result of simulation of pass band loss in the power amplifier circuit 91 as a reference example.

FIG. 6 is a graph depicting one example of a result of simulation of pass band loss in the power amplifier circuit 91 as a reference example. Note that FIG. 6 is read in a manner similar to that in FIG. 5.

A curve L4 indicates pass band loss in the power amplifier circuit 91, that is, the frequency change of 10×log(1−|Gin2|×|Gin2|).

In the power amplifier circuit 91, the pass band loss is −4.0 dB to −2.8 dB in 1.5 GHz to 2.0 GHz where the return loss is lower than or equal to −10. Therefore, in the power amplifier circuit 111, compared with the power amplifier circuit 91, the output power of the amplifier 151 can be favorably transferred to the amplifier 152 in a wider frequency range.

Note that while description has been made to the structure of the matching circuit 171 including the transformer 301 formed of the coils 311, 312, and 313 functioning as inductors or transmission lines, this is not meant to be restrictive. The matching circuit 171 may have a structure including a coupled line formed of three parallel wires in place of the transformer 301. Here, the three parallel wires may be transmission lines such as microstrip lines. Also, each of the three parallel wires may have a linear shape or a coiled shape.

Also, while the structure of the transformer 301 has been described in which the coil 311 and the coil 312 are electromagnetically coupled together and the coil 312 and the coil 313 are electromagnetically coupled together, this is not meant to be restrictive. In the transformer 301, the structure may be such that the coil 311 and the coil 313 are further electromagnetically coupled together. Also, the structure may be such that the coil 311 and the coil 312 are electromagnetically coupled together and the coil 311 and the coil 313 are electromagnetically coupled together, or the structure may be such that the coil 311 and the coil 313 are electromagnetically coupled together and the coil 312 and the coil 313 are electromagnetically coupled together. Also, by these matching circuits including the transformers as described above, the impedance can be favorably matched in a wide frequency range.

[Layout of Transformer 301]

The layout of the transformer 301 is described. Note that the layout of the coupled line can be achieved by a layout similar to the layout of the transformer 301.

In each drawing, an x axis, a y axis, and a z axis may be depicted. The x axis, the y axis, and the z axis form three-dimensional orthogonal coordinates in a right-handed system. In the following, an arrow direction on the x axis may be referred to as an x-axis + side, a direction opposite to the arrow direction may be referred to as an x-axis − side. The same goes for the other axes. Note that the z-axis + side and the z-axis − side may be referred to an "upper side" and a "lower side", respectively. Here, a direction rotating in a clockwise direction when viewed from the upper side to the lower side is defined as a clockwise direction cw. Also, a direction rotating in a counterclockwise direction when viewed from the upper side to the lower side is defined as a counterclockwise direction ccw.

Figure 7:
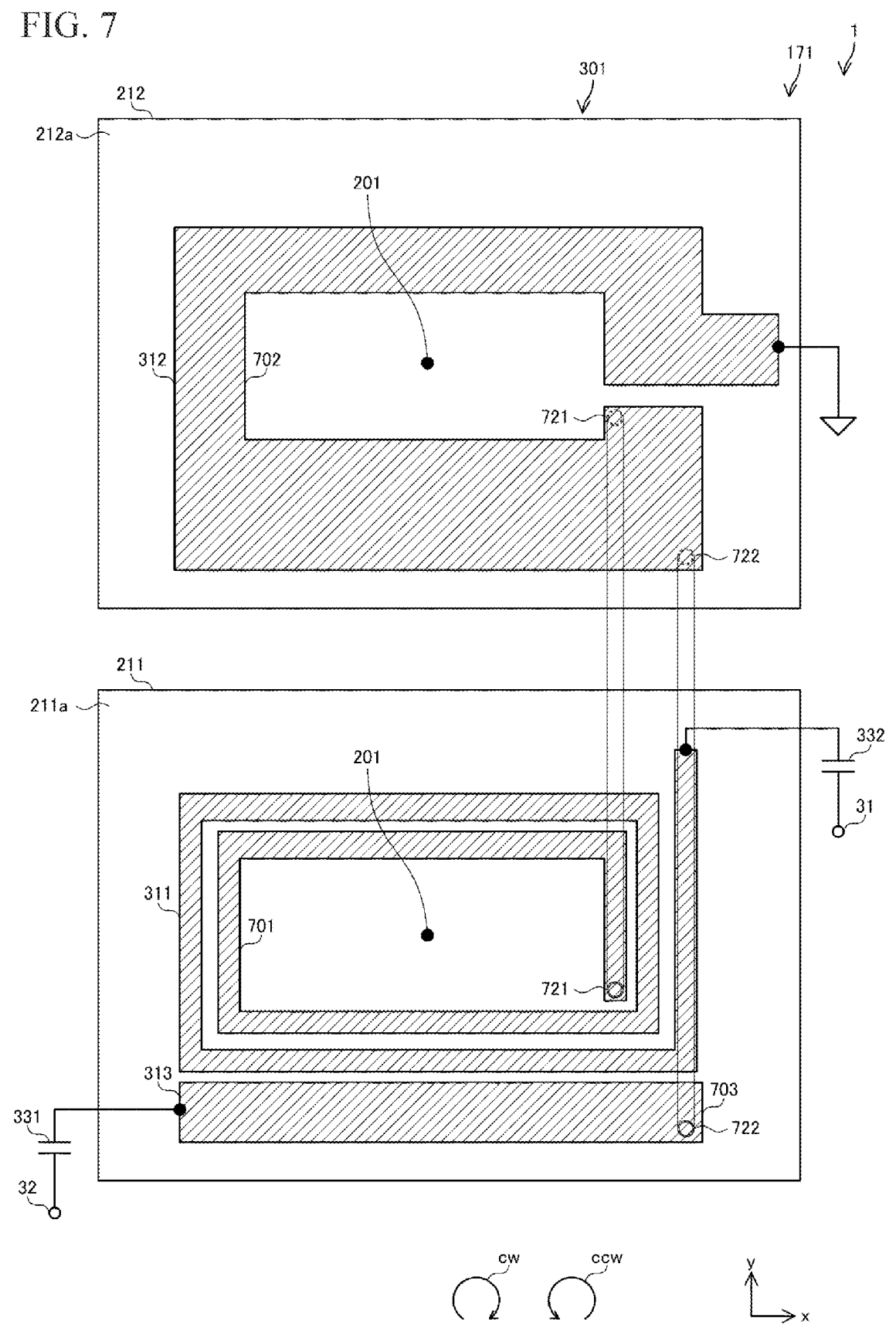

FIG. 7 is a diagram schematically depicting the layout of the transformer 301. As depicted in FIG. 7, the semiconductor device 1 includes two layers, that is, wiring layers 211 and 212, for example. The wiring layers 211 and 212 are provided in this order from the lower side toward the upper side. Note that the semiconductor device 1 may be configured to include three or more wiring layers.

The wiring layers 211 and 212 have a surface 211*a* (first surface) and a surface 212*a* (second surface), respectively. Each of the surface 211*a* and the surface 212*a* intersects with an axis 201 which is parallel to the z axis. In the present embodiment, each of the surface 211*a* and the surface 212*a* is set to be orthogonal to the axis 201. Note that the structure may be such that each of the surface 211*a* and the surface 212*a* of the respective wiring layers 211 and 212 is not parallel to an xy plane due to, for example, variations in manufacturing or the like, and these surfaces may be substantially parallel to the xy plane, that is, substantially orthogonal to the axis 201.

The coil 311 is formed of a metal wire 701 (first conductive member) wound around the axis 201 on the surface 211*a* of the wiring layer 211, and the metal wire 701 has one end and another end respectively corresponding to the one end and the other end of the coil 311.

In the present embodiment, when the surface 211*a* is viewed in plan view from the upper side along a direction perpendicular to the surface 211*a* (which may be hereinafter simply referred to as "when the surface 211*a* is viewed in plan view" and the same goes for the other surfaces), the metal wire 701 is wound around the axis 201 in the clockwise direction cw by two turns or more and less than two and half turns from the one end toward the other end as approaching the axis 201.

The coil 312 is formed of a metal wire 702 (second conductive member) wound around the axis 201 on the surface 212*a* of the wiring layer 212, and the metal wire 702 has one end and another end respectively corresponding to the one end and the other end of the coil 312. In the present embodiment, when the surface 212*a* is viewed in plan view, the metal wire 702 is formed in a C shape with its x-axis + side open.

When the surface 212*a* is viewed in plan view, the direction in which the metal wire 702 is wound from the one end toward the other end of the metal wire 702 is identical to the direction in which the metal wire 701 is wound from the one end toward the other end of the metal wire 701.

Specifically, the metal wire 702 is wound around the axis 201 from the one end toward the other end in the clockwise direction cw by ¾ turn or more and less than one turn. The one end of the metal wire 702 is connected to the other end of the metal wire 701 through an interlayer via 721.

The coil 313 is formed of a metal wire 703 (third conductive member) wound around the axis 201 on the surface 211*a* of the wiring layer 211, and the metal wire 703 has one end and another end respectively corresponding to the one end and the other end of the coil 313.

When the surface 211*a* is viewed in plan view, the direction in which the metal wire 703 is wound from the one end toward the other end of the metal wire 703 is identical to the direction in which the metal wire 701 is wound from the one end toward the other end of the metal wire 701.

Specifically, on the y-axis − side of the axis 201, the metal wire 703 extends from the one end toward the other end to the x-axis − side substantially in parallel to the x axis. This corresponds to the metal wire 703 wound around the axis 201 from the one end toward the other end in the clockwise direction cw by ¼ turn or more and less than ½ turn. The one end of the metal wire 703 is connected to the one end of the metal wire 702 through an interlayer via 722.

When the surface 211*a* is viewed in plan view, at least part of the metal wire 701 and at least part of the metal wire 703 overlap the metal wire 702. Specifically, when the surface 211*a* is viewed in plan view, an area of a portion where the metal wire 701 and the metal wire 702 overlap (which may be hereinafter referred to as a first overlapping area) is more than or equal to 50% of the area of the metal wire 701. Preferably, the first overlapping area is more than or equal to 60% of the area of the metal wire 701. In the present embodiment, the first overlapping area is more than or equal to 75% of the area of the metal wire 701.

Further, when the surface 211*a* is viewed in plan view, an area of a portion where the metal wire 703 and the metal wire 702 overlap (which may be hereinafter referred to as a second overlapping area) is more than or equal to 50% of the area of the metal wire 703. Preferably, the second overlapping area is more than or equal to 60% of the area of the metal wire 703. In the present embodiment, the second overlapping area is more than or equal to 75% of the area of the metal wire 703.

With the above-described layout of the metal wires 701, 702, and 703 and the interlayer vias 721 and 722, the area required for the arrangement of the coils 311, 312, and 313 when viewed from the upper side, that is, the area of the transformer 301, can be reduced. This allows the matching circuit 171 with a wide frequency band to be formed in a compact manner.

Note that while the structure has been described in which the wiring layers 211 and 212 are provided in this order from the lower side toward the upper side, this is not meant to be restrictive. The order in which the wiring layers 211 and 212 are provided is not limited to this order and may be a reversed order.

Also, while the structure has been described in which the metal wires 701 and 703 are formed on the surface 211*a*, this is not meant to be restrictive. The structure may be such that the metal wires 701 and 703 are formed on different surfaces.

Embodiment 2

A power amplifier circuit 112 according to Embodiment 2 is described. In Embodiment 2 and later embodiments, description of matters common to Embodiment 1 is omitted, and only a different point is described. In particular, similar operation and effect by a similar structure are not mentioned one by one for each embodiment.

Figure 8:
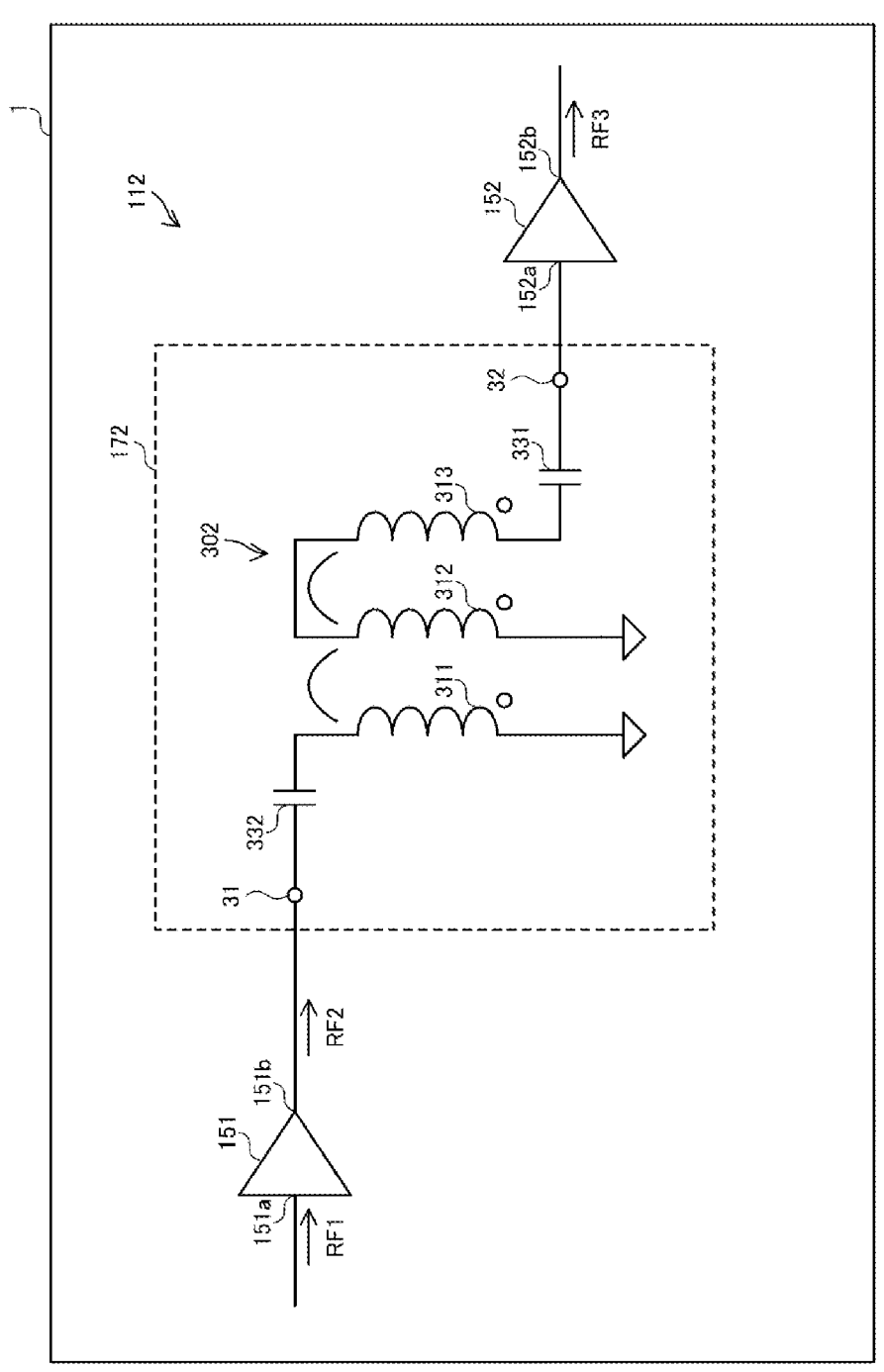
FIG. 8 is a circuit diagram of a power amplifier circuit 112.

FIG. 8 is a circuit diagram of the power amplifier circuit 112. As depicted in FIG. 8, the power amplifier circuit 112 according to Embodiment 2 is different from the power amplifier circuit 111 according to Embodiment 1 in that the coils 311 and 312 are compound transformers.

Compared with the power amplifier circuit 111 depicted in FIG. 1, the power amplifier circuit 112 includes a matching circuit 172 in place of the matching circuit 171. Compared with the matching circuit 171 depicted in FIG. 1, the matching circuit 172 includes a transformer 302 in place of the transformer 301. The transformer 302 includes the coil 311 (first wire), the coil 312 (second wire), and the coil 313 (third wire).

The coil 311 in the transformer 302 has one end connected to the other end of the capacitor 332 and another end connected to the ground (first reference potential). The coil 312 has one end and another end connected to the ground (second reference potential), and is electromagnetically coupled to the coil 311. Here, the polarity of the coil 311 is the same as the polarity of the coil 312.

The coil 313 has one end connected to the one end of the coil 312 and another end connected to the one end of the capacitor 331, and is electromagnetically coupled to the coil 312. Here, the polarity of the coil 312 is the same as the polarity of the coil 313.

Note that while the structure of the transformer 302 has been described in which the coil 311 and the coil 312 are electromagnetically coupled together and the coil 312 and the coil 313 are electromagnetically coupled together, this is not meant to be restrictive. In the transformer 302, the structure may be such that the coil 311 and the coil 313 are further electromagnetically coupled together. Also, the structure may be such that the coil 311 and the coil 312 are electromagnetically coupled together and the coil 311 and the coil 313 are electromagnetically coupled together, or the structure may be such that the coil 311 and the coil 313 are electromagnetically coupled together and the coil 312 and the coil 313 are electromagnetically coupled together.

Also in the power amplifier circuit 112 according to Embodiment 2, the matching circuit 172 is configured of the coils 311, 312, and 313 electromagnetically coupled to one another. Therefore, as with the power amplifier circuit 111 according to Embodiment 1, also in the present embodiment, in a frequency range wider than ever, it is possible to favorably match impedance and favorably transfer output power of the amplifier 151 to the amplifier 152.

Embodiment 3

Figure 9:
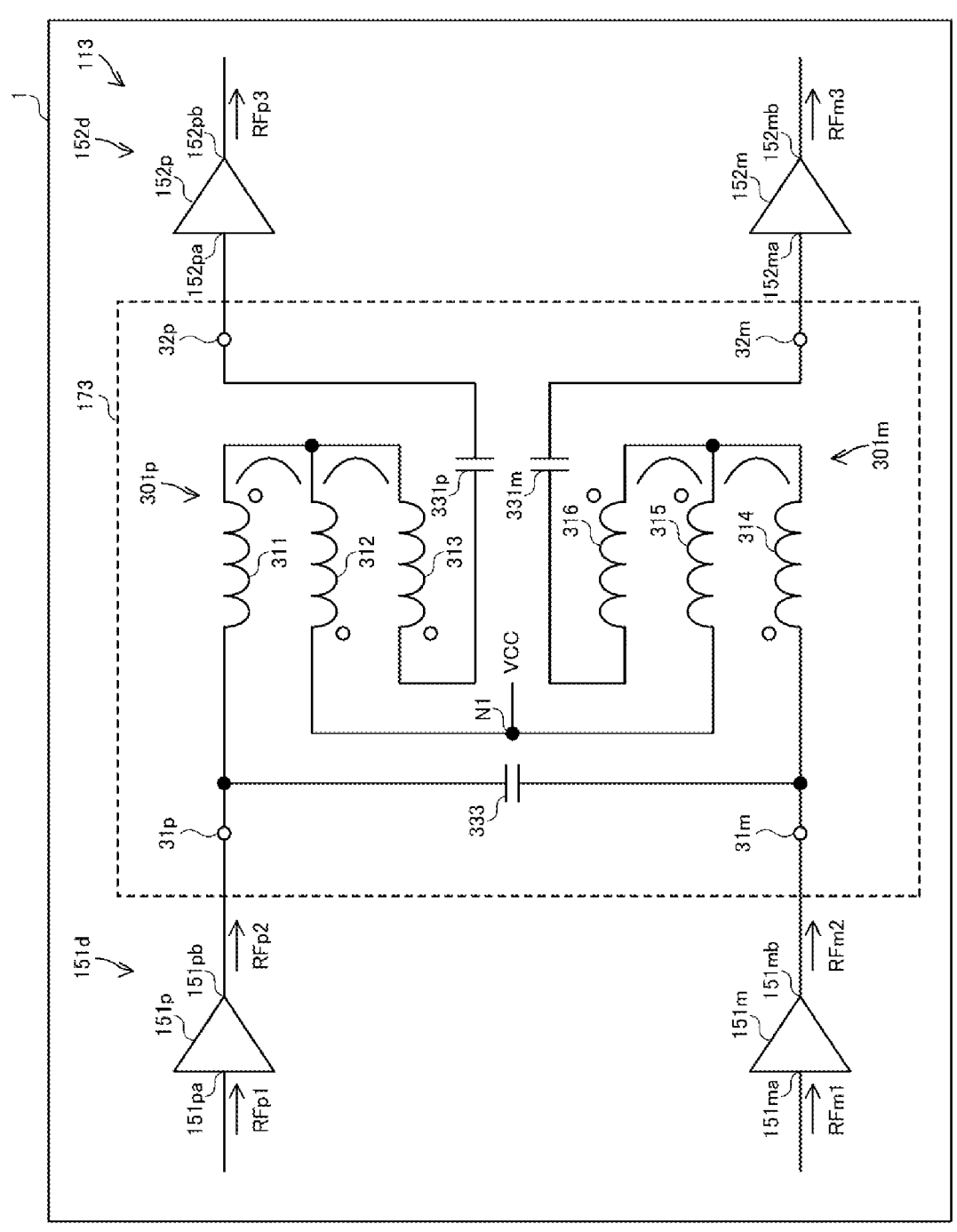
FIG. 9 is a circuit diagram of a power amplifier circuit 113.

A power amplifier circuit 113 according to Embodiment 3 is described. FIG. 9 is a circuit diagram of the power amplifier circuit 113. As depicted in FIG. 9, the power amplifier circuit 113 according to Embodiment 3 is different from the power amplifier circuit 111 according to Embodiment 1 in that a circuit combining two transformers 301 is used as an interstage matching circuit of a fully-differential two-stage amplifier.

The power amplifier circuit 113 is a circuit which amplifies a balanced signal including signals RFp1 and RFm1 to output a balanced signal including amplified signals RFp3 and RFm3. The phase of the signal RFp1 is different from the phase of the signal RFm1 by approximately 180°. Also, the phase of the amplified signal RFp3 is different from the phase of the amplified signal RFm3 by approximately 180°. Note that the phase difference may be greatly different from 180° depending on the imbalance of the wire length of the circuit.

The power amplifier circuit 113 includes a differential pair 151*d* (first differential pair), a differential pair 152*d* (second differential pair), and a matching circuit 173. The differential pair 151*d* includes an amplifier 151*p* and an amplifier 151*m*. The differential pair 152*d* includes an amplifier 152*p* and an amplifier 152*m*. The amplifier 151*m* has input/output characteristics substantially identical to input/output characteristics of the amplifier 151*p*. The amplifier 152*m* has input/output characteristics substantially identical to input/output characteristics of the amplifier 152*p*.

The matching circuit 173 includes transformers 301*p* and 301*m*, capacitors 331*p* and 331*m*, and a capacitor 333. The transformer 301*p* includes the coil 311 (first wire), the coil 312 (second wire), and the coil 313 (third wire). The transformer 301*m* includes a coil 314 (fourth wire), a coil 315 (fifth wire), and a coil 316 (sixth wire).

The matching circuit 173 is an interstage matching circuit provided between the differential pair 151*d* at a driver stage and the differential pair 152*d* at a power stage to match impedance between the differential pair 151*d* and the differential pair 152*d*.

The amplifier 151*p* in the differential pair 151*d* has an input terminal 151*pa* and an output terminal 151*pb*. The input terminal 151*pa* is supplied with the signal RFp1. The output terminal 151*pb* is connected to an input terminal 31*p* (first terminal) in the matching circuit 173 and outputs an amplified signal RFp2 obtained by amplifying the signal RFp1.

The amplifier 151*m* has an input terminal 151*ma* and an output terminal 151*mb*. The input terminal 151*ma* is supplied with the signal RFm1. The output terminal 151*mb* is connected to an input terminal 31*m* (third terminal) in the matching circuit 173 and outputs an amplified signal RFm2 obtained by amplifying the signal RFm1.

The capacitor 333 in the matching circuit 173 is provided between the input terminal 31p and the input terminal 31m. Note that the capacitor 333 may be omitted.

The coil 311 in the transformer 301p has one end connected to the input terminal 31p and another end. The coil 312 has one end connected to the other end of the coil 311 and another end connected to a node N1 (first reference potential), and is electromagnetically coupled to the coil 311. The node N1 is supplied with power for operating the amplifiers 151p and 151m, for example, power supply voltage VCC.

The coil 313 has one end connected to the one end of the coil 312 and another end, and is electromagnetically coupled to the coil 312. The capacitor 331p has one end connected to the other end of the coil 313 and another end connected to an output terminal 32p (second terminal). Note that the capacitor 331p may be omitted.

The coil 314 in the transformer 301m has one end connected to the input terminal 31m and another end. The coil 315 has one end connected to the other end of the coil 314 and another end connected to the node N1, and is electromagnetically coupled to the coil 314.

The coil 316 has one end connected to the one end of the coil 315 and another end, and is electromagnetically coupled to the coil 315. The inductance of the coil 316 is smaller than the inductance of the coil 314 and the inductance of the coil 315.

The capacitor 331m has one end connected to the other end of the coil 316 and another end connected to an output terminal 32m (fourth terminal). Note that the capacitor 331m may be omitted.

The amplifier 152p in the differential pair 152d has an input terminal 152pa and an output terminal 152pb. The input terminal 152pa is connected to the output terminal 32p, and is supplied with the amplified signals RFp2 and RFm2 passing through the matching circuit 173. The output terminal 152pb outputs the amplified signal RFp3 obtained by amplifying the amplified signals RFp2 and RFm2.

The amplifier 152m has an input terminal 152ma and an output terminal 152mb. The input terminal 152ma is connected to the output terminal 32m, and is supplied with the amplified signals RFp2 and RFm2 passing through the matching circuit 173. The output terminal 152mb outputs the amplified signal RFm3 obtained by amplifying the amplified signals RFp2 and RFm2.

Note that, with the matching circuit 173 provided at a preceding stage or a subsequent stage of the differential pair, the matching circuit 173 can be also used as an input matching circuit or an output matching circuit of that differential pair.

Embodiment 4

Figure 10:
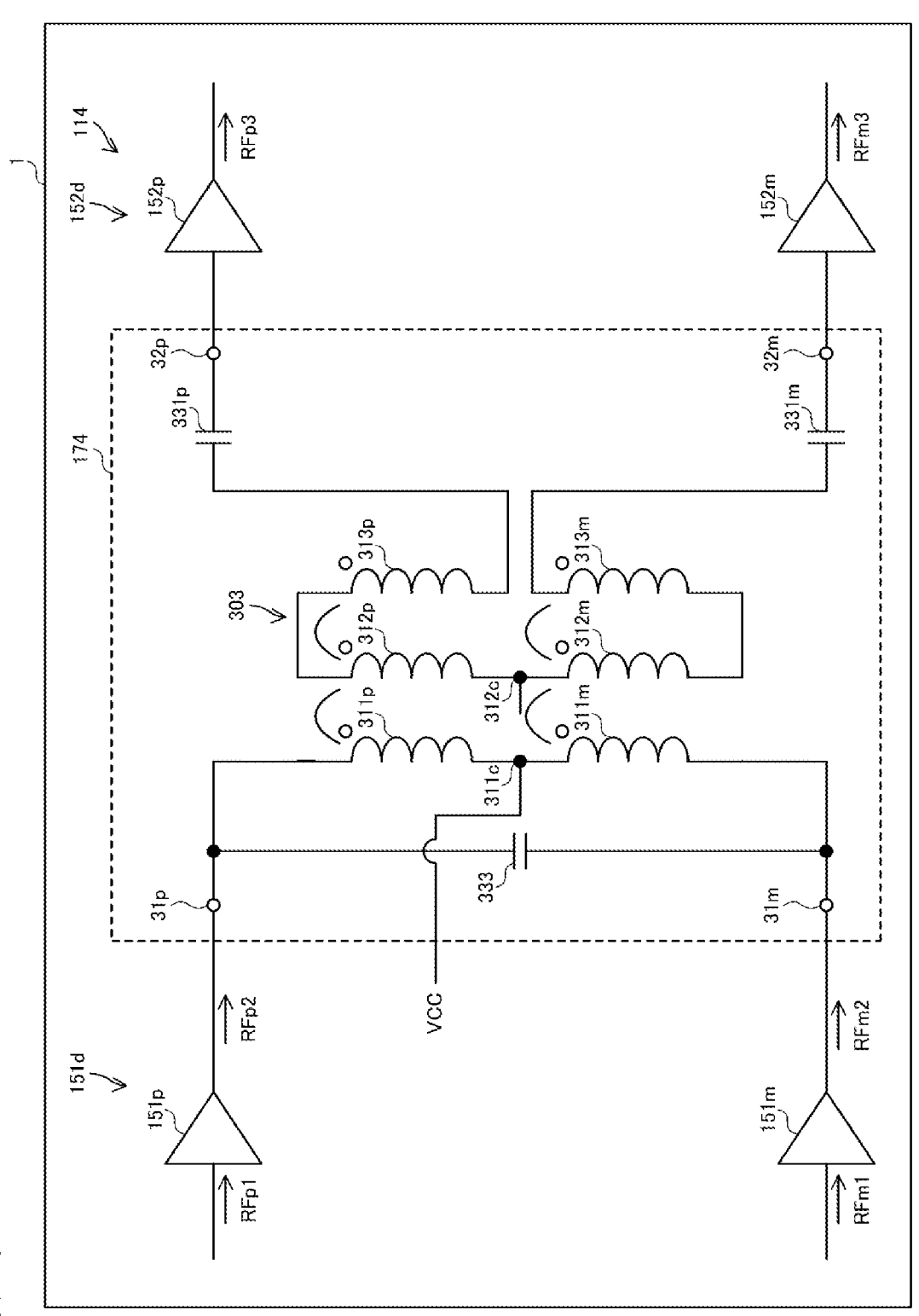
FIG. 10 is a circuit diagram of a power amplifier circuit 114.

A power amplifier circuit 114 according to Embodiment 4 is described. FIG. 10 is a circuit diagram of the power amplifier circuit 114. As depicted in FIG. 10, the power amplifier circuit 114 according to Embodiment 4 is different from the power amplifier circuit 113 according to Embodiment 3 in that the coils 311p and 312p and the coils 311m and 312m are compound transformers.

Compared with the power amplifier circuit 113 depicted in FIG. 9, the power amplifier circuit 114 includes a matching circuit 174 in place of the matching circuit 173. Compared with the matching circuit 173 depicted in FIG. 9, the matching circuit 174 includes a transformer 303 in place of the transformers 301p and 301m. The transformer 303 includes a coil 311p (first wire), a coil 312p (second wire), a coil 313p (third wire), a coil 311m (fourth wire), a coil 312m (fifth wire), and a coil 313m (sixth wire).

The coil 311p in the transformer 303 has one end connected to the input terminal 31p and another end connected to a center tap 311c (first reference potential). The center tap 311c is supplied with power supply voltage VCC.

The coil 312p has one end and another end connected to a center tap 312c (second reference potential), and is electromagnetically coupled to the coil 311p. The center tap 312c is in an imaginary short.

The coil 313p has one end connected to the one end of the coil 312p and another end connected to one end of the capacitor 331p, and is electromagnetically coupled to the coil 312p. The inductance of the coil 313p is smaller than the inductance of the coil 311p and the inductance of the coil 312p.

The coil 311m has one end connected to the input terminal 31m and another end connected to the center tap 311c. The coil 312m has one end and another end connected to the center tap 312c, and is electromagnetically coupled to the coil 311m.

The coil 313m has one end connected to the one end of the coil 312m and another end connected to one end of the capacitor 331m, and is electromagnetically coupled to the coil 312m. The inductance of the coil 313m is smaller than the inductance of the coil 311m and the inductance of the coil 312m.

Note that, with the matching circuit 174 provided at a preceding stage or a subsequent stage of the differential pair, the matching circuit 174 can be also used as an input matching circuit or an output matching circuit of that differential pair.

Embodiment 5

Figure 11:
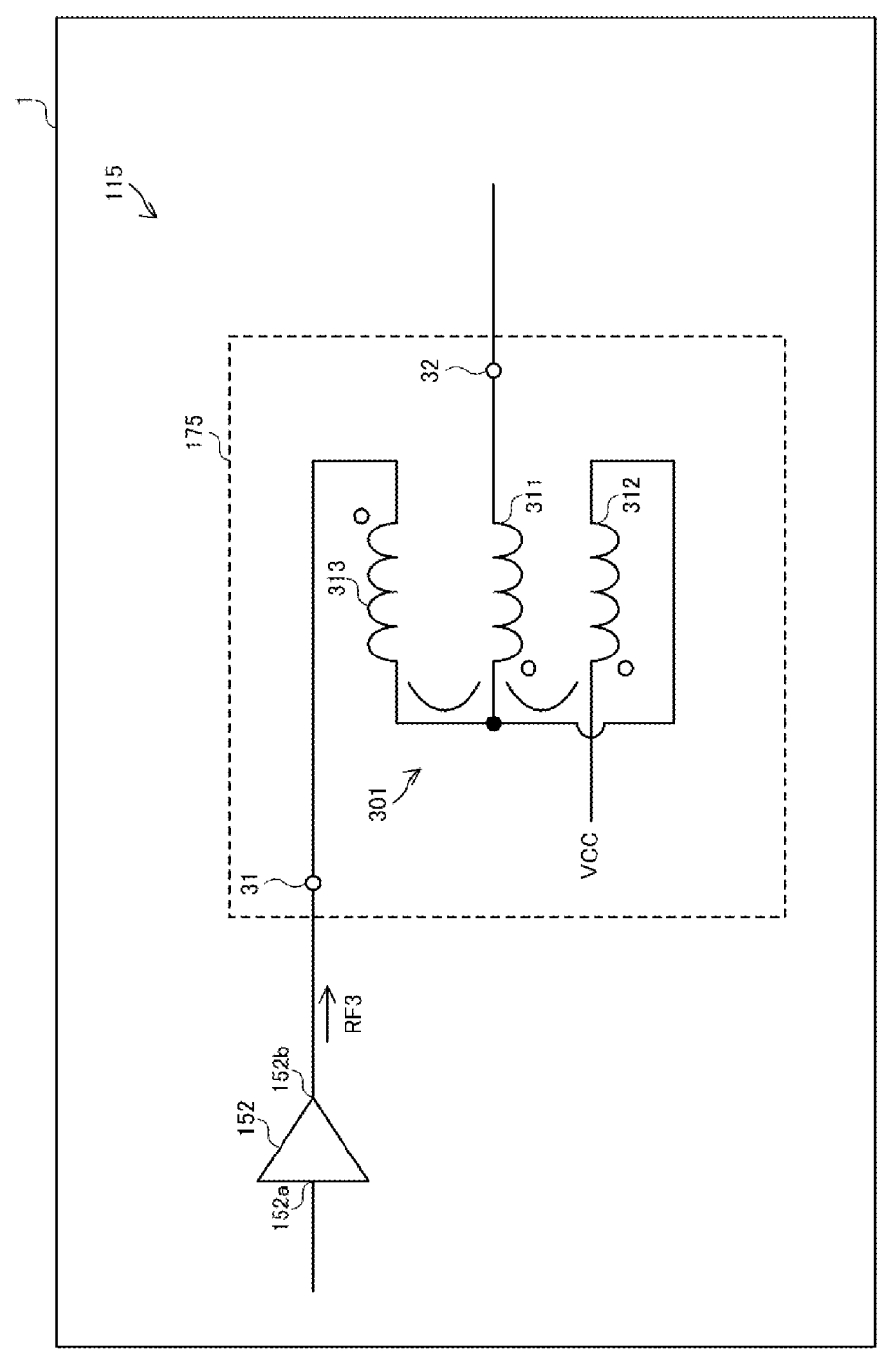
FIG. 11 is a circuit diagram of a power amplifier circuit 115.

A power amplifier circuit 115 according to Embodiment 5 is described. FIG. 11 is a circuit diagram of the power amplifier circuit 115. As depicted in FIG. 11, the power amplifier circuit 115 according to Embodiment 5 is different from the power amplifier circuit 111 according to Embodiment 1 in that the transformer 301 is used as an output matching circuit.

The power amplifier circuit 115 includes the amplifier 152 at a power stage and a matching circuit 175. The matching circuit 175 includes the transformer 301.

The other end of the coil 313 in the transformer 301 is connected to the output terminal 152b of the amplifier 152 through the input terminal 31. The one end of the coil 313 is connected to the one end of the coil 312. The coil 313 is electromagnetically coupled to the coil 311.

The other end of the coil 312 is connected to a voltage source for supplying power for operating the amplifier 152, for example, power supply voltage VCC (first reference potential). The coil 312 is electromagnetically coupled to the coil 311. The other end of the coil 311 is connected to the one end of the coil 312. The one end of the coil 311 is connected to the output terminal 32.

Embodiment 6

Figure 12:
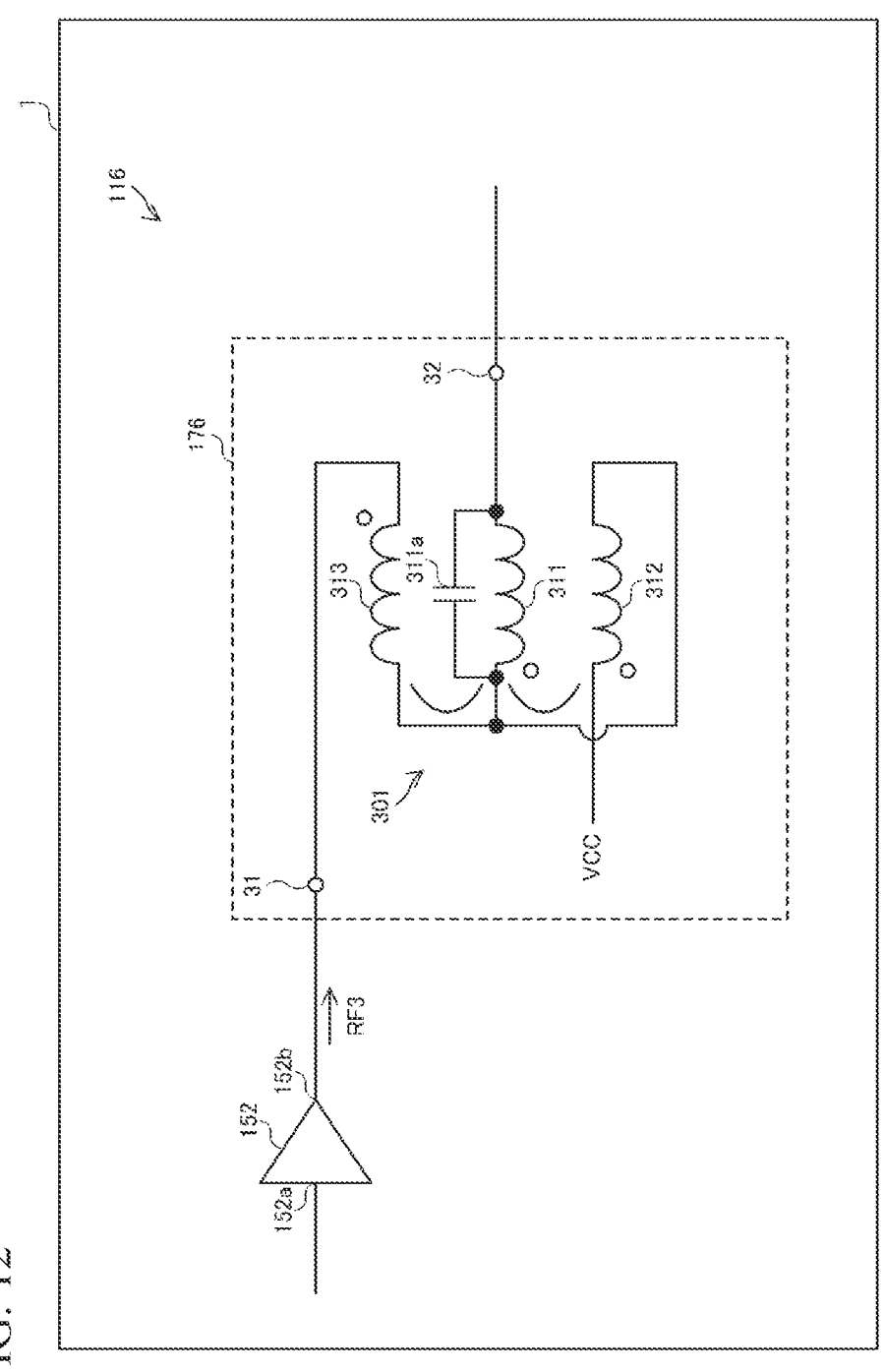
FIG. 12 is a circuit diagram of a power amplifier circuit 116.

A power amplifier circuit 116 according to Embodiment 6 is described. FIG. 12 is a circuit diagram of the power amplifier circuit 116. As depicted in FIG. 12, the power amplifier circuit 116 according to Embodiment 6 is different from the power amplifier circuit 115 according to Embodiment 5 in that a capacitor is connected in parallel to a coil.

Compared with the power amplifier circuit 115 depicted in FIG. 11, the power amplifier circuit 116 includes a matching circuit 176 in place of the matching circuit 175. Compared with the matching circuit 175 depicted in FIG. 11, the matching circuit 176 further includes a capacitor 311*a* (third capacitor).

The capacitor 311*a* has one end connected to the one end of the coil 311 and another end connected to the other end of the coil 311.

As described above, with the structure in which the capacitor 311*a* is provided in parallel to the coil 311, an LC parallel circuit can be provided to a wire to which the amplified signal RF3 is transmitted. Also, for example, by setting the resonant frequency of the LC parallel circuit at harmonic frequency of the amplified signal RF3, the transmission of the harmonic waves to the output terminal 32 can be suppressed.

Note that while the structure has been described in which the capacitor 311*a* is provided in parallel to the coil 311, this is not meant to be restrictive. The structure may be such that the capacitor 311*a* (fourth capacitor) is provided in parallel to the coil 312.

As described above, with the structure in which the capacitor 311*a* is provided in parallel to the coil 312, an LC parallel circuit can be provided to a wire branched from a wire to which the amplified signal RF3 is transmitted. Also, for example, by setting the resonant frequency of the LC parallel circuit at the basic wave frequency of the amplified signal RF3, a short circuit of the basic wave at a voltage source as a low-impedance node for an alternating current signal can be suppressed. Also, a short circuit of the harmonic wave of the amplified signal RF3 can be made at that voltage source. That is, while the basic wave of the amplified signal RF3 can be favorably transmitted to the output terminal 32, the transmission of the harmonic wave of the amplified signal RF3 to the output terminal 32 can be suppressed.

Also, the structure may be such that the capacitor 311*a* is connected in parallel to the coil 313.

Also, in the power amplifier circuits 111 to 116, while the structure has been described in which a signal is transmitted from the input terminal 31 to the output terminal 32 (from the input terminals 31*p* and 31*m* to the output terminals 32*p* and 32*m*), this is not meant to be restrictive. The structure may be such that a signal is transmitted from the output terminal 32 to the input terminal 31 (from the output terminals 32*p* and 32*m* to the input terminals 31*p* and 31*m*).

Figure 13:
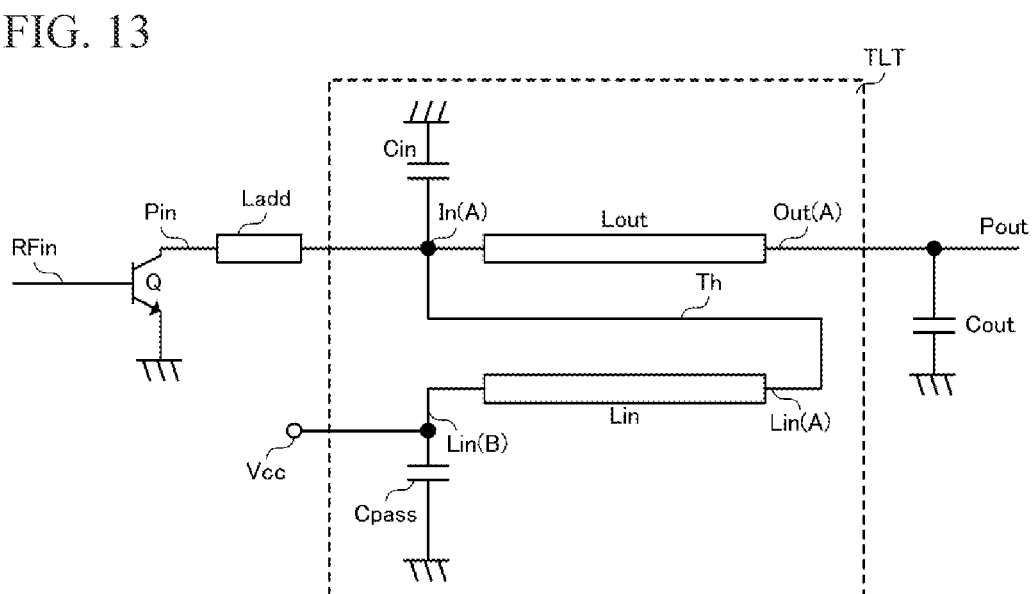
FIG. 13 is an equivalent circuit diagram of the last amplifier stage of a RF power amplifier described as the related art in Japanese Unexamined Patent Application Publication No. 2009-88770.

In the foregoing, the exemplary embodiments of the present disclosure have been described. The band of a transmission line transformer may be narrowed due to element characteristics or a parasitic element. For example, one end Lin(B) of a sub-line Lin in a RF power amplifier depicted in FIG. 13 is ideally connected to the ground for a RF signal.

However, there is a possibility that the one end Lin(B) is not ideally connected to the ground due to characteristics of a bypass capacitance Cpass provided between the one end Lin(B) and the ground and a wire from the one end Lin(B) to the bypass capacitance Cpass. Therefore, the band of the transmission line transformer is narrowed. Here, a method of widening the band by connecting a plurality of transmission line transformers can be thought. However, this is not preferable because the circuit size is increased.

By contrast, in the matching circuits 171, 175, and 176, the first wire has one end connected to the input terminal 31 and another end. The second wire has one end connected to the other end of the first wire and another end connected to the first reference potential and is electromagnetically coupled to the first wire. The third wire has one end connected to the one end of the second wire and another end connected to the output terminal 32 and is electromagnetically coupled to at least one of the first wire and the second wire.

As described above, with the structure in which the first wire and the second wire are electromagnetically coupled together and the third wire and at least one of the first wire and the second wire are electromagnetically coupled together, a matching circuit having characteristics similar to those of a matching circuit using two or more stages of transformers or coupled lines formed of two wires can be achieved by a one-stage transformer including three wires. That is, by having characteristics similar to those of a matching circuit using two or more stages of transformers or coupled lines, it is possible to suppress an increase in return loss and a decrease in pass band loss for the basic frequency of a radio frequency signal in a wide frequency band. Also, while four or more wires are required for a conventional matching circuit using two or more stages of transformers or coupled lines, the number of wires can be reduced by a one-stage transformer including three wires. Thus, an increase in circuit size can be suppressed. Therefore, it is possible to provide a matching circuit capable of favorably matching impedance between a circuit at a preceding stage and a circuit at a subsequent stage in a wide frequency band, while an increase in circuit size is suppressed.

Also, in the matching circuit 172, the first wire has one end connected to the input terminal 31 and another end connected to the first reference potential. The second wire has one end and another end connected to the second reference potential and is electromagnetically coupled to the first wire. The third wire has one end connected to the one end of the second wire and another end connected to the output terminal 32 and is electromagnetically coupled to at least one of the first wire and the second wire.

As described above, with the structure in which the first wire and the second wire are electromagnetically coupled together and the third wire and at least one of the first wire and the second wire are electromagnetically coupled together, a matching circuit having characteristics similar to those of a matching circuit using two stages of transformers or coupled lines can be achieved by three wires. That is, by having characteristics similar to those of a matching circuit using two stages of transformers or coupled lines, it is possible to suppress an increase in return loss and a decrease in pass band loss for the basic frequency of a radio frequency signal in a wide frequency band. Also, by reducing the number of wires to three, an increase in circuit size can be suppressed. Furthermore, the electrical isolation between the first wire and the second wire can be enhanced. Therefore, it is possible to provide a matching circuit capable of favorably matching impedance between a circuit at a preceding stage and a circuit at a subsequent stage in a wide frequency band, while an increase in circuit size is suppressed.

Furthermore, in the matching circuit 171, the first wire is formed of the metal wire 701 on the surface 211*a*. The second wire is formed of the metal wire 702 on the surface 212*a*. The third wire is formed of the metal wire 703 on the surface 211*a*. When the surface 211*a* is viewed in plan view along a direction perpendicular to the surface 211*a*, at least part of the metal wire 701 and at least part of the metal wire 703 overlap the metal wire 702. When the surface 211*a* is viewed in plan view along the direction, a direction in which the metal wire 701 is wound from the one end toward the other end of the first wire, a direction in which the metal wire 702 is wound from the one end toward the other end of the second wire, and a direction in which the metal wire 703 is wound from the one end toward the other end of the third wire are identical.

As described above, with the structure in which the metal wires 701, 702, and 703 are respectively formed on the surfaces 211*a*, 212*a*, and 211*a*, the first wire, the second wire, and the third wire can be formed by two wiring layers. Thus, the thickness of a substrate where the matching circuit 171 is provided can be decreased. Also, with the structure in which, when the surface 211*a* is viewed in plan view, at least part of the metal wire 701 and at least part of the metal wire 703 overlap the metal wire 702, electromagnetic coupling between wires can be sufficiently ensured, while the area occupied by the matching circuit 171 is suppressed.

Still further, in the matching circuits 171 and 172, the capacitor 331 is provided between the other end of the third wire and the output terminal 32.

As described above, with the structure in which the capacitor 331 is provided between the other end of the third wire and the output terminal 32, the frequency band in which impedance can be favorably matched can be further widened. Also, since conduction of a direct current can be prevented, for example, when the input terminal 152*a* of the amplifier 152 is connected to the output terminal 32, a short circuit of bias of the amplifier 152 to the ground can be prevented.

Still further, in the matching circuits 171 and 172, the capacitor 332 is provided between the input terminal 31 and the one end of the first wire.

As described above, with the structure in which the capacitor 332 is provided between the input terminal 31 and the one end of the first wire, the frequency band in which impedance can be favorably matched can be further widened. Also, since the size of the capacitor 332 may be small, an increase in circuit size can be suppressed. Furthermore, since conduction of a direct current can be prevented, for example, when the input terminal of the amplifier is connected to the input terminal 31, a short circuit of bias of the amplifier to the ground can be prevented.

Still further, in the matching circuit, the input terminal 31 is connected to the amplifier 151.

With this structure, for example, when the input terminal 31 is connected to the output terminal 151*b* of the amplifier 151, even if the impedance matching ratio is large, favorable matching can be achieved by the matching circuit. Also, for example, when the input terminal 31 is connected to the input terminal 151*a* of the amplifier 151, the matching circuit can be used as an input matching circuit.

Still further, in the matching circuit, the output terminal 32 is connected to the amplifier 152.

With this structure, for example, when the output terminal 32 is connected to the input terminal 152*a* of the amplifier 152, the matching circuit can be used as an input matching circuit. Also, for example, when the output terminal 32 is connected to the output terminal 152*b* of the amplifier 152, even if the impedance matching ratio is large, favorable matching can be achieved by the matching circuit.

Still further, each of the matching circuits 171 and 172 is provided between the amplifier 151 and the amplifier 152 in cascading connection to the amplifier 151.

With this structure, even if the impedance matching ratio is large, favorable matching can be achieved by the matching circuits 171 and 172.

Still further, in the matching circuit 176, the capacitor 311*a* is connected in parallel to the first wire or the third wire.

As described above, with the structure in which the capacitor 311*a* is provided in parallel to the first wire or the third wire, an LC parallel circuit can be provided to a wire to which the amplified signal RF3 is transmitted. Also, for example, by setting the resonant frequency of the LC parallel circuit at the harmonic frequency of the amplified signal RF3, the transmission of the harmonic waves to the output terminal 32 can be suppressed.

Still further, in the matching circuit 176, the capacitor 311*a* is connected in parallel to the second wire.

As described above, with the structure in which the capacitor 311*a* is provided in parallel to the second wire, an LC parallel circuit can be provided to a wire branched from a wire to which the amplified signal RF3 is transmitted. Also, for example, by setting the resonant frequency of the LC parallel circuit at the basic wave frequency of the amplified signal RF3, a short circuit of the basic wave at a voltage source as a low-impedance node for an alternating current signal can be suppressed. That is, the basic wave of the amplified signal RF3 can be favorably transmitted to the output terminal 32.

Still further, in the matching circuits 171, 172, 175, and 176, inductance of the third wire is smaller than inductance of the first wire and inductance of the second wire.

With this structure, impedance between a circuit at a preceding stage and a circuit at a subsequent stage can be matched by a simple structure.

Still further, in the matching circuits 171, 172, 175, and 176, each of the first wire, the second wire, and the third wire is a transmission line.

With this structure, while electromagnetic coupling is sufficiently ensured in the frequency band of a radio frequency signal, a coupled line can be formed with ease.

Still further, in the matching circuits 171, 172, 175, and 176, each of the first wire, the second wire, and the third wire is an inductor.

With this structure, while electromagnetic coupling is sufficiently ensured in the frequency band of a radio frequency signal and attenuation effects are obtained for signals with frequencies other than a desired frequency (operating frequency), a coupled line can be formed with ease.

Still further, in the matching circuits 171, 172, 175, and 176, each of the first wire, the second wire, and the third wire is a coil.

As described above, with the structure in which each of the first wire, the second wire, and the third wire is configured of a coil in which large inductance can be easily ensured, electromagnetic coupling between wires can be sufficiently ensured.

Still further, in the matching circuit 173, the first wire has one end connected to the input terminal 31*p* and another end. The second wire has one end connected to the other end of the first wire and another end connected to the first reference potential and is electromagnetically coupled to the first wire. The third wire has one end connected to the one end of the second wire and another end connected to the output terminal 32*p* and is electromagnetically coupled to at least one of the first wire and the second wire. The fourth wire has one end connected to the input terminal 31*m* and another end. The fifth wire has one end connected to the other end of the fourth wire and another end connected to the first reference potential and is electromagnetically coupled to the fourth wire. The sixth wire has one end connected to the one end of the fifth wire and another end connected to the output terminal 32*m* and is electromagnetically coupled to at least one of the fourth wire and the fifth wire.

With this structure, it is possible to provide a matching circuit capable of favorably matching impedance between a circuit at a preceding stage and a circuit at a subsequent stage in a wide frequency band for a balanced signal, while an increase in circuit size is suppressed.

Still further, in the matching circuit 174, the first wire has one end connected to the input terminal 31*p* and another end connected to the first reference potential. The second wire has one end and another end connected to the second reference potential and is electromagnetically coupled to the first wire. The third wire has one end connected to the one end of the second wire and another end connected to the output terminal 32*p* and is electromagnetically coupled to at least one of the first wire and the second wire. The fourth wire has one end connected to the input terminal 31*m* and another end connected to the first reference potential. The fifth wire has one end and another end connected to the second reference potential and is electromagnetically coupled to the fourth wire. The sixth wire has one end connected to the one end of the fifth wire and another end connected to the output terminal 32*m* and is electromagnetically coupled to at least one of the fourth wire and the fifth wire.

With this structure, it is possible to provide a matching circuit capable of favorably matching impedance between a circuit at a preceding stage and a circuit at a subsequent stage in a wide frequency band for a balanced signal, while an increase in circuit size is suppressed. Also, since the first wire and the fourth wire and the second wire and the fifth wire are insulated, the electrical isolation between the first wire and the fourth wire and the second wire and the fifth wire can be enhanced.

Still further, in the matching circuit, the input terminals 31*p* and 31*m* are connected to the differential pair 151*d*.

With this structure, for example, when the input terminals 31*p* and 31*m* are respectively connected to the output terminal 151*pb* of the amplifier 151*p* and the output terminal 151*mb* of the amplifier 151*m*, even if the impedance matching ratio is large, favorable matching can be achieved by the matching circuit. Also, for example, when the input terminals 31*p* and 31*m* are respectively connected to the input terminal 151*pa* of the amplifier 151*p* and the input terminal 151*ma* of the amplifier 151*m*, the matching circuit can be used as an input matching circuit.

Still further, in the matching circuits 173 and 174, the output terminals 32*p* and 32*m* are connected to the differential pair 152*d*.

With this structure, for example, when the output terminals 32*p* and 32*m* are respectively connected to the input terminal 152*pa* of the amplifier 152*p* and the input terminal 152*ma* of the amplifier 152*m*, each matching circuit can be used as an input matching circuit. Also, for example, when the output terminals 32*p* and 32*m* are respectively connected to the output terminal 152*pb* of the amplifier 152*p* and the output terminal 152*mb* of the amplifier 152*m*, even if the impedance matching ratio is large, favorable matching can be achieved by each matching circuit.

Still further, each of the matching circuits 173 and 174 is provided between the differential pair 151*d* and the differential pair 152*d* in cascading connection to the differential pair 151*d*.

With this structure, even if the impedance matching ratio is large, favorable matching can be achieved by the matching circuits 173 and 174.

Also, in the matching circuits 173 and 174, the input terminals 31*p* and 31*m* are connected to the differential pair 151*d*. The first reference potential is supplied with power for operating the differential pair 151*d*.

With this structure, power for operating the differential pair 151*d* can be supplied without separate provision of a power supply line. Thus, an increase in circuit size of the matching circuits 173 and 174 can be suppressed.

Note that each of the above-described embodiments is for ease of understanding the present disclosure and is not for restrictively interpreting the present disclosure. The present disclosure can be modified/improved without deviating from the gist of the present disclosure and also includes its equivalents. That is, those having the design of each embodiment modified by a person skilled in art as appropriate are also included in the scope of the present disclosure as long as they include the features of the present disclosure. For example, each of the components included in each embodiment and their arrangements, materials, conditions, shapes, sizes, and so forth are not limited to those exemplarily described and can be changed as appropriate. Also, each embodiment is merely an example, and it goes without saying that the structures described in different embodiments can be partially replaced or combined and these are also included in the scope of the present disclosure as long as they include the features of the present disclosure.

What is claimed is:

1. A matching circuit comprising:
a first wire having a first end connected to a first terminal;
a second wire having a first end connected to a second end of the first wire, and a second end connected to a first reference potential, the second wire being electromagnetically coupled to the first wire; and
a third wire having a first end connected to the first end of the second wire, and a second end connected to a second terminal, the third wire being electromagnetically coupled to the first wire or the second wire.

2. The matching circuit according to claim 1, wherein:
the first wire comprises a first conductive member on a first surface of a substrate,
the second wire comprises a second conductive member on a second surface of a substrate,
the third wire comprises a third conductive member on the first surface of a substrate,
when the first surface is viewed in plan view along a direction perpendicular to the first surface, at least part of the first conductive member and at least part of the third conductive member overlap the second conductive member, and
when the first surface is viewed in plan view along the direction perpendicular to the first surface, a direction in which the first conductive member is wound from the first end of the first wire toward the second end of the first wire, a direction in which the second conductive member is wound from the first end of the second wire toward the second end of the second wire, and a direction in which the third conductive member is wound from the first end of the third wire toward the second end of the third wire are identical.

3. The matching circuit according to claim 1, further comprising:
a first capacitor connected between the second end of the third wire and the second terminal, or
a second capacitor connected between the first terminal and the first end of the first wire.

4. The matching circuit according to claim 1, wherein the first terminal or the second terminal is connected to an amplifier.

5. The matching circuit according to claim 1, wherein the matching circuit is connected between a first amplifier and a second amplifier that is cascade-connected to the first amplifier.

6. The matching circuit according to claim 1, wherein an inductance of the third wire is less than an inductance of the first wire and is less than an inductance of the second wire.

7. The matching circuit according to claim 1, wherein each of the first wire, the second wire, and the third wire is a transmission line.

8. The matching circuit according to claim 1, wherein each of the first wire, the second wire, and the third wire is an inductor.

9. The matching circuit according to claim 1, wherein each of the first wire, the second wire, and the third wire is a coil.

\*  \*  \*  \*  \*